(12) United States Patent
Okunuki

(10) Patent No.: US 6,787,784 B1
(45) Date of Patent: Sep. 7, 2004

(54) CHARGED-PARTICLE BEAM DRAWING DATA CREATION METHOD, AND CHARGED-PARTICLE BEAM DRAWING APPARATUS USING THE SAME

(75) Inventor: Masahiko Okunuki, Akiruno (JP)

(73) Assignee: Canon Kabushiki Kaisha, Tokyo (JP)

( * ) Notice: Subject to any disclaimer, the term of this patent is extended or adjusted under 35 U.S.C. 154(b) by 445 days.

(21) Appl. No.: 09/604,739

(22) Filed: Jun. 28, 2000

(30) Foreign Application Priority Data

Jul. 1, 1999 (JP) .......................................... 11-187692

(51) Int. Cl.[7] .............................. G21K 5/10; G06K 9/00
(52) U.S. Cl. ................... 250/492.22; 430/30; 430/296; 382/144; 382/145; 250/492.1
(58) Field of Search ............................. 716/21; 430/22, 430/296; 382/144, 145; 250/492.3, 492.22, 492.1, 492.21

(56) References Cited

U.S. PATENT DOCUMENTS

| | | | | |
|---|---|---|---|---|
| 4,267,456 A | * | 5/1981 | Hidai et al. | 250/492.3 |
| 4,896,045 A | | 1/1990 | Okunuki et al. | 250/492.2 |
| 4,897,552 A | | 1/1990 | Okunuki et al. | 250/492.2 |
| 4,974,736 A | | 12/1990 | Okunuki et al. | 219/121.12 |
| 5,253,182 A | * | 10/1993 | Suzuki | 716/21 |
| 5,430,304 A | | 7/1995 | Yasuda et al. | 250/492.22 |
| 5,757,409 A | * | 5/1998 | Okamoto et al. | 347/230 |
| 6,037,601 A | | 3/2000 | Okunuki | 250/492.23 |
| 6,054,713 A | | 4/2000 | Miyake et al. | 250/492.24 |
| 6,064,807 A | * | 5/2000 | Arai et al. | 716/21 |
| 6,144,760 A | * | 11/2000 | Ohnuma | 382/144 |
| 6,159,644 A | * | 12/2000 | Satoh et al. | 430/22 |
| 6,317,866 B1 | * | 11/2001 | Tamura | 716/21 |

* cited by examiner

*Primary Examiner*—John R. Lee
*Assistant Examiner*—Mary El-Shammaa
(74) *Attorney, Agent, or Firm*—Fitzpatrick, Cella, Harper & Scinto

(57) ABSTRACT

A charged-particle beam drawing data creation method of supplying bit information created from design pattern data in the scanning direction of a charged-particle beam, ON/OFF-controlling the charged-particle beam to irradiate a sample surface, and exposing a two-dimensional pattern by scanning the charged-particle beam includes the step of extracting a cell pattern as one unit of a periodic structure from design pattern data having a periodic structure, and registering the cell pattern, the step of creating arrangement data to be rearranged in a basic drawing region defined by a charged-particle beam exposure apparatus using the cell pattern, and registering the arrangement data, and the step of cutting out data from the cell pattern in accordance with information of the arrangement data, and creating data of the basic drawing region.

20 Claims, 11 Drawing Sheets

FIG. 3A

| | |
|---|---|
| THE NUMBER OF CELL PATTERNS (mMC,nSC) | —STEP A1 |
| DESIGNATE CELL PATTERN:MC | —STEP A2 |
| COORDINATES OF POSITION | —STEP A3 |
| CUTOUT START POINT | —STEP A4 |
| CUTOUT SIZE (dx,dy) | —STEP A5 |
| DESIGNATE CELL PATTERN:MC | —STEP A6 |
| COORDINATES OF POSITION | —STEP A7 |
| CUTOUT START POINT | —STEP A8 |
| CUTOUT SIZE (dx,dy) | —STEP A9 |
| — | —STEP A10 |
| — | —STEP A11 |
| DESIGNATE CELL PATTERN:SC | —STEP A12 |
| COORDINATES OF POSITION | —STEP A13 |
| DESIGNATE CELL PATTERN:SC | —STEP A14 |
| COORDINATES OF POSITION | —STEP A15 |
| CUTOUT START POINT | —STEP A16 |
| CUTOUT SIZE (dx,dy) | —STEP A17 |
| — | —STEP A18 |

ARRANGEMENT DESIGNATION STEP FOR CELL PATTERN MC: STEP A2–A9

ARRANGEMENT DESIGNATION STEP FOR CELL PATTERN SC: STEP A12–A17

FIG. 3B

| | |
|---|---|
| (1,0) | —STEP B1 |
| MC1 | —STEP B2 |
| (0,0) | —STEP B3 |
| (0,0) | —STEP B4 |
| (1,1) | —STEP B5 |
| — | —STEP B6 |
| — | —STEP B7 |
| (2,0) | —STEP B8 |
| MC1 | —STEP B9 |
| (0,0) | —STEP B10 |
| (0.8,0) | —STEP B11 |
| (0.3,1) | —STEP B12 |
| MC2 | —STEP B13 |
| (0.3,0) | —STEP B14 |
| (0,0) | —STEP B15 |
| (0.7,1) | —STEP B16 |
| — | —STEP B17 |
| — | —STEP B18 |

FOR MF1,1: STEP B1–B5

FOR MF2,1: STEP B8–B16

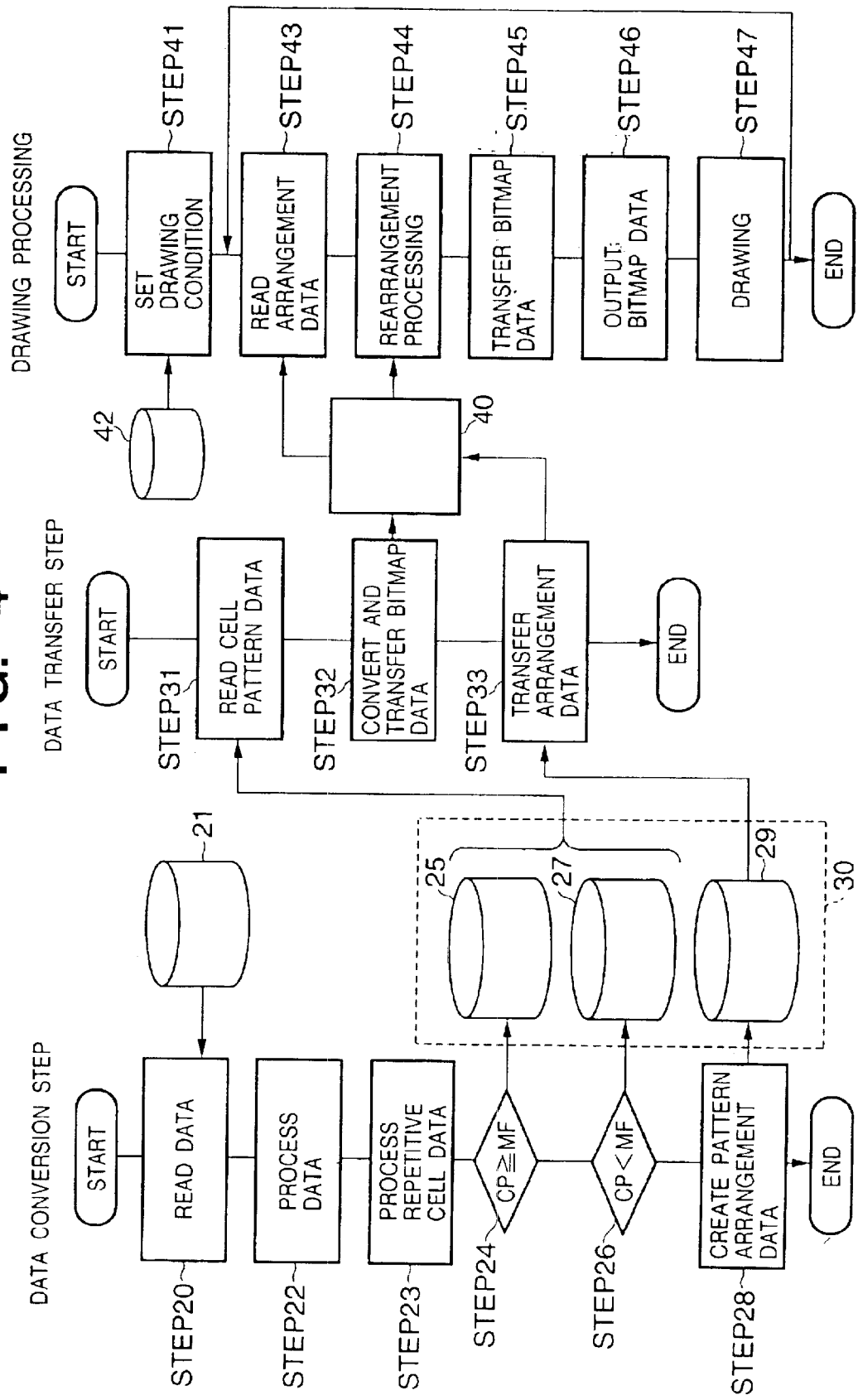

(STAGE SCANNING) X
Y (BEAM DEFLECTION)

CHARGED-PARTICLE BEAM DRAWING DATA CREATION METHOD, AND CHARGED-PARTICLE BEAM DRAWING APPARATUS USING THE SAME

FIELD OF THE INVENTION

The present invention relates to a charged-particle beam drawing method for drawing the pattern of a semiconductor integrated circuit such as an LSI on a sample such as a mask or wafer at high speed and high precision and, more particularly, to a data creation method for realizing high-precision drawing using drawing pattern data prepared by compressing data, and a charged-particle beam drawing apparatus using the same.

BACKGROUND OF THE INVENTION

In recent years, LSI patterns continue to shrink in feature size and increase in integration degree. For example, the integration degree of DRAMs is increasing from 64 M to 256 M, 1 G, and 4 G. The micropatterning technique is one of the most important process techniques.

An electron beam drawing apparatus, which can perform micropatterning at 0.1 μm or less, is expected as an effective exposure means for forming a highly integrated LSI pattern. In drawing a desired LSI pattern using this electron beam drawing apparatus, design pattern data created by a pattern data creation tool such as a CAD used for LSI pattern design cannot be directly supplied as drawing pattern data for the electron beam drawing apparatus. For this reason, design pattern data must be converted into a data system receivable by the electron beam drawing apparatus so as to draw the data at a high speed.

An example of the electron beam drawing apparatus will be described. FIG. 9 shows the data flow (prior art) of a drawing system. In the data conversion step, design pattern data 51 stored in an external storage device such as a magnetic disk is read in the memory of a computer in data read (step 50). In data processing (step 52), a multiple-exposed region is removed, and correction processing such as proximity effect correction is done. Then, basic figure division (step 53) into a rectangle, trapezoid, triangle, and the like is executed for each unit drawing region determined by a beam deflection region. Accordingly, the design pattern data 51 is converted into drawing pattern data 55 receivable by the electron beam drawing apparatus.

In drawing data storage (step 54), the converted drawing pattern data 55 is stored in an external storage device represented by a magnetic disk.

In the data transfer step, the drawing pattern data 55 converted in the previous step is read in step 56, transferred to a buffer memory in step 57, and registered in step 58. Then, the data transfer step is complete.

In the drawing step, JOB data 61 serving as drawing schedule data of the electron beam apparatus is read in drawing condition setting (step 60). In stripe data read (step 62), drawing pattern data of one stripe to be drawn by one stage scanning is read out from the buffer memory in step 58. The drawing pattern data made up of basic figures undergoes bitmapping processing (step 63). The bitmap data is transferred to a pattern memory in step 64, and output to a beam blanker serving as a beam-ON/OFF means in step 65. Then, an electron beams is ON/OFF-controlled to draw a pattern (step 66). After one stripe is drawn, the drawing step restarts from stripe data read (step 62) for drawing the next stripe. This is repeated to complete drawing of all chips placed on a wafer.

FIG. 10 is a block diagram showing an electron beam drawing apparatus for drawing a pattern in accordance with data flow (prior art) of the above drawing system. The electron beam drawing apparatus is roughly constituted by an electron beam drawing apparatus main body 280 and a drawing control system 290. The electron beam drawing apparatus main body 280 is comprised of an electron gun 201, convergent lens 202, reduction lens 203, deflector 204, blanker 205, and stage 207. An electron beam EB emitted by the electron gun 201 is converged into 0.1 μm or less via the convergent lens 202 and reduction lens 203 to irradiate a wafer 208 on the stage. The electron beam EB is adjusted in position by the deflector 204 (made up of two, a main deflector 204-1 and a sub-deflector 204-2), and ON/OFF-controlled by the blanker 205.

An electron beam EB emitted by the electron gun 201 is converged into 0.1 μm or less via the convergent lens 202 and reduction lens 203 to irradiate a wafer 208 on the stage. The electron beam EB is adjusted in position by the deflector 204 (made up of two, main deflector 204-1 and sub-deflector 204-2), and ON/OFF-controlled by the blanker 205.

In the drawing control system 290, drawing pattern data 224 stored in an external storage device 210 such as a magnetic disk is transferred via a CPU 212 to an internal buffer memory 214 of a drawing data processing unit 219 on the basis of settings from a console 211. The data format of the drawing pattern data 224 is a basic figure such as a rectangle, trapezoid, triangle, or the like, which is obtained by dividing design pattern data into figures. The drawing pattern data 224 is subjected in figure calculation processing 217 to calculation processing of converting data of one stripe to be drawn by one stage scanning into bitmap data. Then, the bitmap data is transferred to a pattern memory 218.

After the bitmap data is transferred to a blanker control unit 220, the electron beam EB is ON/OFF-controlled. In synchronism with this, a deflector control unit 222 settles the beam position, and a stage control unit 223 controls the stage position. A series of drawing operations is performed.

FIGS. 11A to 11C show a drawing method when the deflector 204 shown in FIG. 10 is made up of the two, main deflector 204-1 and sub-deflector 204-2. The stage reciprocally scans in a direction (X) perpendicular to the beam deflection direction (Y) of the electron beam EB by the main deflector 204-1, thereby drawing a pattern on all the regions of chips 251 arrayed on the wafer 208. Within the region of a main field 252 scanned by the main deflector 204-1, the sub-deflector 204-2 deflects the electron beam EB to draw a pattern in the region of a smaller subfield 254. The region where the electron beam EB is deflected in the subfield 254 is defined as a basic drawing region, which is reflected on data of basic figure division in creating drawing pattern data from design pattern data in the data conversion step.

As described above, in the conventional electron beam drawing apparatus, design pattern data is defined by a figure system comprised of receivable basic figures (rectangle, trapezoid, triangle, and the like). Further, the design pattern data is defined by a data system obtained by region division for each unit drawing region which depends on the drawing method of the electron beam drawing apparatus. In this manner, drawing pattern data is created to draw a pattern.

However, this method suffers the following problem.

More specifically, when sorting processing (data rearrangement processing in the drawing order) is executed in units of basic drawing regions while design pattern data created by the CAD is converted into drawing pattern data, the repetitive periodic structure of the pattern of the design pattern data becomes different in size from the unit drawing region of the electron beam drawing apparatus, and becomes different in size from the main field. If the design pattern data is simply divided in units of unit drawing regions/main field regions, the repetitive periodic structure is inhibited. The data must be mapped into many independent divided patterns, which makes it difficult to compress drawing pattern data. For this reason, the pattern regularity defined by the design pattern data is destroyed to increase the data amount and prolong the data conversion time.

Also, in the data transfer step before the start of drawing, a time required to transfer drawing pattern data obtained by data conversion from an external storage device represented by a magnetic disk to a buffer memory unit is prolonged. In the drawing step, a long time is spent on bitmapping drawing pattern data made up of basic figures.

From this, the time required for a series of data processes decreases the throughput of the electron beam drawing apparatus.

Recently, there is proposed a method of drawing a pattern by ON/OFF-controlling a plurality of electron beams in parallel with each other using multi-beams. A plurality of electron beams are arranged in m rows×n columns (m and n are integers of 1 or more), and each electron beam draws a pattern in a basic drawing region, thereby drawing a two-dimensional pattern. This high-speed drawing method also suffers the same problem because the periodicity of design pattern data does not coincide with that of basic drawing regions arranged in m rows×n columns. This inhibits increasing the speed of the electron beam drawing apparatus.

In this situation, compression of drawing pattern data is limited in the current data conversion step. Moreover, the speeds of the data conversion and drawing steps cannot be increased. The above-mentioned problem decreases the availability of the electron beam drawing apparatus, and decreases the productivity of LSIs. This may pose a serious problem on increasing the reliability of an LSI pattern drawn by the electron beam drawing apparatus and the availability of the apparatus along with shrinkage in LSI feature size and increase in integration degree.

SUMMARY OF THE INVENTION

The present invention has been proposed to solve the conventional problems, and has as its object to provide a drawing pattern data creation method capable of increasing the compression efficiency of drawing pattern data, increasing the speed of the drawing step, and thus increasing the throughput even when the periodicity of design pattern data is different from the arrangement periodicity of basic drawing regions defined by the drawing method of an electron beam drawing apparatus, and an electron beam drawing apparatus using the same.

To achieve the above object, a data creation method and a charged-particle beam drawing apparatus using the same according to the present invention comprise the following steps and arrangement.

That is, a charged-particle beam drawing data creation method of supplying bit information created from design pattern data in a scanning direction of a charged-particle beam, ON/OFF-controlling the charged-particle beam to irradiate a sample surface, and exposing a two-dimensional pattern by scanning the charged-particle beam comprises the steps of:

extracting a cell pattern as one unit of a periodic structure from design pattern data having a periodic structure, and registering the cell pattern, creating arrangement data to be rearranged in a basic drawing region defined by a charged-particle beam exposure apparatus using the cell pattern, and registering the arrangement data, and cutting out data from the cell pattern in accordance with information of the arrangement data, and creating data of the basic drawing region.

According to one preferable aspect of the present invention, in the charged-particle beam drawing data creation method, the basic drawing region includes all or some of regions of a plurality of cell patterns.

According to another preferable aspect of the present invention, in the charged-particle beam drawing data creation method, the cell pattern is not smaller in size than the basic drawing region.

According to still another preferable aspect of the present invention, in the charged-particle beam drawing data creation method, the cell pattern is smaller in size than the basic drawing region.

According to still another preferable aspect of the present invention, in the charged-particle beam drawing data creation method, the basic drawing region includes at least some of cell patterns not smaller in size than the basic drawing region and some of cell patterns smaller in size than the basic drawing region.

According to still another preferable aspect of the present invention, in the charged-particle beam drawing data creation method, the cell pattern is not less than twice the size of the basic drawing region.

According to still another preferable aspect of the present invention, in the charged-particle beam drawing data creation method, the cell pattern is formed from bitmap data.

A charged-particle beam exposure apparatus for supplying bit information created from design pattern data in a scanning direction of a charged-particle beam, ON/OFF-controlling the charged-particle beam to irradiate a sample surface, and exposing a two-dimensional pattern by scanning the charged-particle beam comprises:

means for extracting a cell pattern as one unit of a periodic structure from design pattern data having a periodic structure, and registering the cell pattern, means for creating arrangement data to be rearranged in a basic drawing region defined by the charged-particle beam exposure apparatus using the cell pattern, and registering the arrangement data, and means for cutting out data from the cell pattern in accordance with information of the arrangement data, and creating data of the basic drawing region.

According to one preferable aspect of the present invention, in the charged-particle beam drawing apparatus, the basic drawing region includes all or some of the regions of a plurality of cell patterns.

According to another preferable aspect of the present invention, in the charged-particle beam drawing apparatus, the cell pattern is not smaller in size than the basic drawing region.

According to still another preferable aspect of the present invention, in the charged-particle beam drawing apparatus, the cell pattern is smaller in size than the basic drawing region.

According to still another preferable aspect of the present invention, in the charged-particle beam drawing apparatus, the cell pattern is not less than twice the size of the basic drawing region.

According to still another preferable aspect of the present invention, in the charged-particle beam drawing apparatus, the cell pattern is not less than twice in size the basic drawing region.

According to still another preferable aspect of the present invention, in the charged-particle beam drawing apparatus, the cell pattern is formed from bitmap data.

According to still another preferable aspect of the present invention, the charged-particle beam drawing apparatus further comprises a plurality of charged-particle beams and a plurality of beam-ON/OFF means arranged in m rows×n columns, wherein in a drawing method of drawing patterns in parallel with each other in respective basic drawing regions by the charged-particle beams, bitmap drawing data are supplied in parallel with each other to the respective beam-ON/OFF means in the scanning direction of the charged-particle beam, and the plurality of charged-particle beams are controlled to irradiate a sample surface, thereby drawing a two-dimensional pattern.

The above steps and arrangement can increase the compression efficiency of drawing pattern data, can increase the speed of the drawing step, and thus can increase the throughput even when the periodicity of design pattern data is different from the arrangement periodicity of basic drawing regions defined by the drawing method of the electron beam drawing apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 2A to 2E are views showing formation of the basic drawing region by rearrangement of the cell pattern, in which FIG. 2A is a view showing region division of design pattern data, FIGS. 2B to 2D are views showing formation of the basic drawing region by rearrangement of a cell pattern MC, in which FIG. 2B is a view showing MF1,1, FIG. 2C is a view showing MF2,1, and FIG. 2D is a view showing MF2,2, and FIG. 2E is a view showing formation of the basic drawing region by rearrangement of a cell pattern SC;

FIGS. 3A and 3B are views showing an arrangement data format, in which FIG. 3A is a view showing the arrangement data format, and FIG. 3B is a view showing an arrangement data model;

FIG. 4 is a flow chart showing a drawing data flow using rearrangement of the cell pattern;

FIGS. 5A to 5D are views showing a drawing method for an electron beam drawing apparatus using multi-beams, in which FIG. 5A is a view showing wafer drawing, FIG. 5B is a view showing a main field, FIG. 5C is a view showing a subfield, and FIG. 5D is a view showing a basic drawing region;

FIGS. 11A to 11C are views showing a drawing method for two deflectors, in which FIG. 11A is a view showing wafer drawing, FIG. 11B is a view showing a main field, and FIG. 11C is a view showing a subfield.

DETAILED DESCRIPTION OF THE PREFERRED EMBODIMENTS

Figure 1:
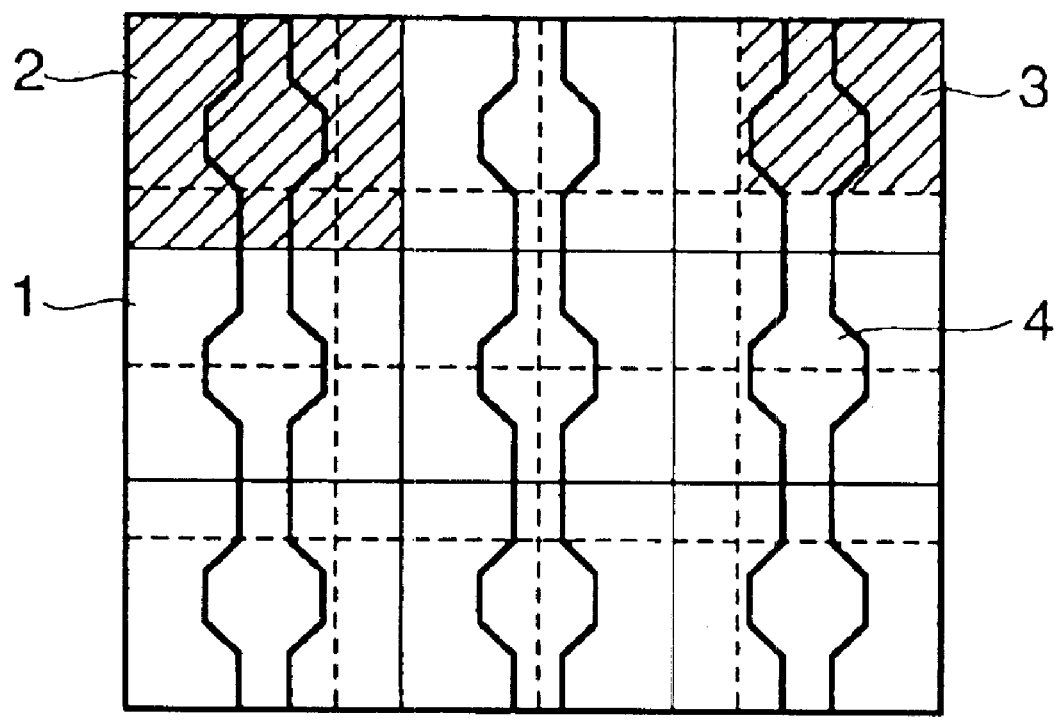
FIG. 1 is a view showing design pattern data divided into cell patterns and basic drawing regions.

Preferred embodiments of the present invention will now be described in detail in accordance with the accompanying drawings.

A conversion method utilizing the repetitive periodic structure of design pattern data in converting the design pattern data into drawing pattern data, and a drawing method using the drawing pattern data will be explained below.

FIG. 1 is a view best showing the present invention. In FIG. 1, design pattern data is divided into cell patterns each serving as one unit of a repetitive periodic structure, and basic drawing regions defined by the deflection method of an electron beam drawing apparatus.

Design pattern data 1 is a wiring pattern 4 for a typical DRAM or the like, and has a repetitive periodic structure. Each cell pattern 2 (solid-line region of the design pattern data 1) is set to maintain the periodicity of the wiring pattern 4. Each basic drawing region 3 (dotted-line region of the design pattern data 1) is determined by the deflection method of the electron beam drawing apparatus, and has a size different from the periodicity of the drawing pattern. The cell pattern 2 is divided as a cell pattern MC larger in size than the basic drawing region 3 (cell pattern MC≧ basic drawing region).

In this embodiment, the cell pattern 2 and the basic drawing region 3 are different in size. If the design pattern data 1 is simply divided into the basic drawing regions 3 at the size of the cell pattern 2, the division number increases to decrease the compression efficiency of drawing pattern data. In terms of data compression, the cell pattern and the basic drawing region must be defined by independent sizes in dividing design pattern data.

Figure 2A:
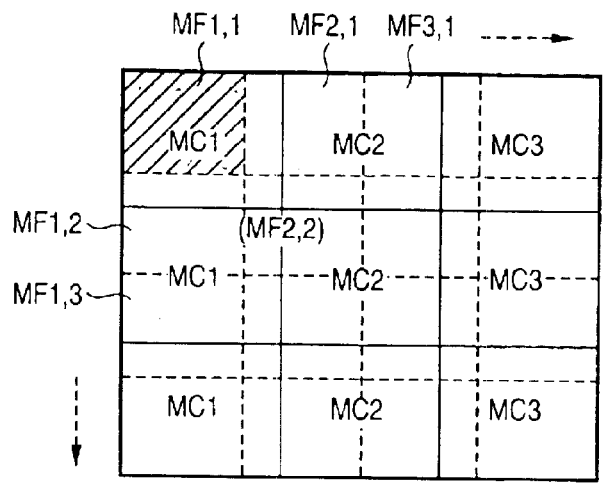

FIGS. 2A to 2E are views showing formation of the basic drawing region by rearrangement of the cell pattern. FIG. 2A is a view showing region division of design pattern data based on the cell pattern and basic drawing region to which reference symbols are affixed. In FIG. 2A, cell patterns are represented as different patterns MC1, MC2, and MC3. The basic drawing regions are symbolized from the left to the right and from the top to the bottom as MF1,1, MF2,1, ... , MF1,2, MF2,2, ... , MF1,3, MF2,3, ... .

Figure 2B:
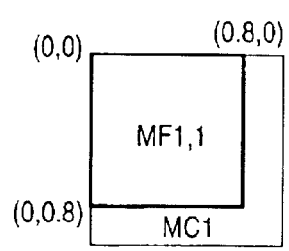
Figure 2C:
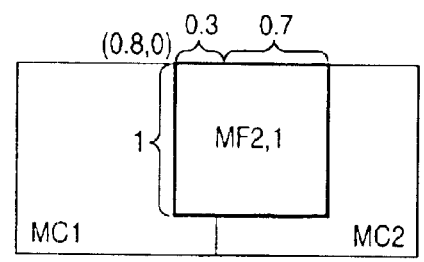
Figure 2D:
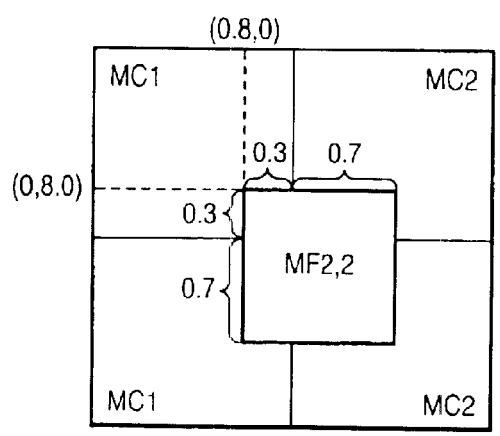

FIGS. 2B and 2C are views showing formation of the basic drawing region by rearrangement of the cell pattern MC. FIG. 2B shows the basic drawing region MF1,1. A pattern corresponding to MF1,1 can be cut out by designating the region of the cell pattern MC1. FIG. 2C shows MF2,1, and FIG. 2D shows MF2,2. Each basic drawing region is located across cell patterns. Thus, in forming the pattern of this basic drawing region, data of the basic drawing region can be formed by designating a cutout region for each of the cell patterns.

When a basic drawing region exists within a single cell pattern, like MF1,2 in FIG. 2A, the size of the cell pattern is set twice or more the size of the basic drawing region. This allows cutting out data of the basic drawing region from the cell pattern by one region designation regardless of the cutout position of the cell pattern.

Figure 2E:
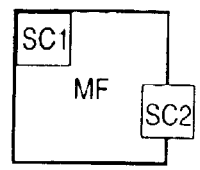

FIG. 2E is a view showing formation of the basic drawing region by rearrangement of a cell pattern SC (basic drawing region) smaller than the basic drawing region. In this case, data of the basic drawing region can be formed by designating an arrangement location within the basic drawing region for a cell pattern SC1, and designating the cutout region of the cell pattern SC for SC2, similar to the cell pattern MC.

For the cell pattern MC, data of the basic drawing region can be formed by designating a region and cutting out a pattern. For the cell pattern SC, data of the basic drawing region can be formed by designating an arrangement location or designating the cutout region of a pattern. From this, drawing data in units of basic drawing regions can be created using, for each basic drawing region, the cell patterns MC and SC, and arrangement data for selecting and arranging the cell patterns MC and SC as drawing pattern data.

The arrangement data format using the cell patterns MC and SC will be explained.

FIGS. 3A and 3B are views showing the arrangement data format in forming data of the basic drawing region. FIG. 3A is a view showing the generalized definition of the arrangement data format. One basic drawing region is made up of one or a plurality of cell patterns MC or SC. This embodiment will exemplify two steps, i.e., the arrangement designation step for the cell pattern MC and that for the cell pattern SC.

In FIG. 3A, mMC and nSC are set as the numbers of cell patterns MC and SC for forming basic drawing regions in step A1. The type of cell pattern MC is designated in step A2, and the coordinates of a paste imposition to a basic drawing region are designated in step A3. A cutout start position in cutting out the cell pattern MC is designated in step A4, and a cutout size (dx,dy) from the cell pattern MC is designated in step A5. In steps A6 to A9, cutout designation for another cell pattern MC is done. This processing is repeated by the number mMC of cell patterns MC designated in step A1.

Step A12 and subsequent steps concern data formation of the cell pattern SC smaller in size than the basic drawing region. The type of cell pattern SC is designated in step A12, and the coordinates of a paste position to a basic drawing region are designated in step A13. Steps A14 to A17 are repeated by the number nSC of cell patterns SC designated in step A1. In this case, the cell pattern SC is located across basic drawing regions, and thus expressed by the same format as that of the cell pattern MC.

Using the above arrangement data format, data of the basic drawing region can be formed from a prepared cell pattern. Since a pattern smaller than the basic drawing region can also be rearranged, the present invention can also be applied to a device structure such as an ASIC having a low pattern periodicity.

FIG. 3B is a view showing an arrangement data model in FIGS. 2B and 2C. In steps B1 to B5, pattern arrangement for MF1,1 is executed. One cell pattern MC is designated in step B1. The type of cell pattern MC is designated to MC1 in step B2, and the coordinates (0,0) of a paste position to the basic drawing region MF1,1 are designated in step B3. In step B4, the cutout start position (0,0) of bitmap data of the cell pattern MC1 is designated (in this case, the size of each of the basic drawing region and cell pattern in the X and Y directions is defined as one unit). In step B5, a cutout size (dx,dy) from the bitmap data of the cell pattern MC1 is designated. In this case, a cutout size (1,1) is designated.

In steps B8 to B16, data arrangement in MF2,1 is performed. In step B8, two cell patterns MC are designated. Similar to MF1,1, the type of cell pattern MC is designated to MC1 in step B9. The coordinates (0,0) of a paste position to a basic drawing region are designated in step B10, and a cutout start position (0.8,0) from the cell pattern MC1 is designated in step B11. In step B12, a cutout size (0.3,1) is designated. In steps B13 to B16, the cutout step from the cell pattern MC2 is repeated for two cell patterns MC designated in step B8.

FIG. 4 is a flow chart showing drawing data processing by rearrangement of the cell pattern using a data compression method and a data mapping method in the present invention.

In the data conversion step, design pattern data 21 stored in an external storage device such as a magnetic disk is read in the memory of a computer in data read (step 20). In data processing (step 22), a multiple-exposed region is removed, and correction processing such as proximity effect correction is done.

Then, the periodicity of the design pattern data is determined, and the flow shifts to the step of converting the design pattern data into drawing pattern data. Data processing (step 23) for repetitive cells from the design pattern data is executed, and the size of a cell pattern CP is compared with that of a basic drawing region MF. In step 24, cell patterns CP larger than the basic drawing region MF are determined, and registered as cell patterns MC 25.

In step 26, cell patterns CP smaller than the basic drawing region MF are determined, and registered as cell patterns SC 27. In step 28, arrangement data for rearranging data in units of basic drawing regions is created using the cell patterns MC 25 and SC 27 divided/classified from the design pattern data. The obtained data is registered as arrangement data 29. The cell pattern adopts a bitmap data format, but may use the above-described basic figures. In this case, data made up of the cell patterns MC 25 and SC 27 and the arrangement data 29 are defined as drawing pattern data 30.

In the data transfer step, the cell patterns MC 25 and SC 27 registered as the drawing pattern data 30 are read out from the external storage device in step 31. In step 32, bitmap data of the cell patterns are transferred to a buffer memory 40 of a drawing control system. In step 33, the arrangement data 29 is read out from the external storage device, and transferred to the buffer memory 40, completing the data transfer step.

For the DRAM, patterns can be drawn in almost all the regions by division of the cell pattern by preparing almost 100 types of cell patterns. Thus, division of the cell pattern can be effectively utilized.

When the size of the cell pattern is 8 $\mu$m, and the interval of one bit is 0.025 $\mu$m, the data amount of bitmap data of all cell patterns is 10×10⁶ bits. This data amount is much smaller than a data amount of 640×10⁹ bits obtained when pattern data of a 20 mm×20 mm-size chip is directly used as bitmap data. Cell patterns can, therefore, be stored in the buffer memory.

In the drawing step, JOB data 42 is read in drawing condition setting (step 41), and arrangement data of one stripe to be drawn by one stage scanning is read in step 43. In step 44, this arrangement data is mapped into bitmap drawing data for drawing a pattern. The bitmap drawing data is transferred to a pattern memory in step 45.

The bitmap data is output to the beam-ON/OFF means of a blanker control unit or BAA (Blanking Aperture Array) control unit in step 46, and a pattern is drawn in step 47.

Drawing is done by reciprocally scanning the stage. During stripe drawing, arrangement data of the next stripe region is read out from the buffer memory. Bitmap drawing data is formed and transferred to another pattern memory to prepare for drawing the next stripe region.

Figure 10:
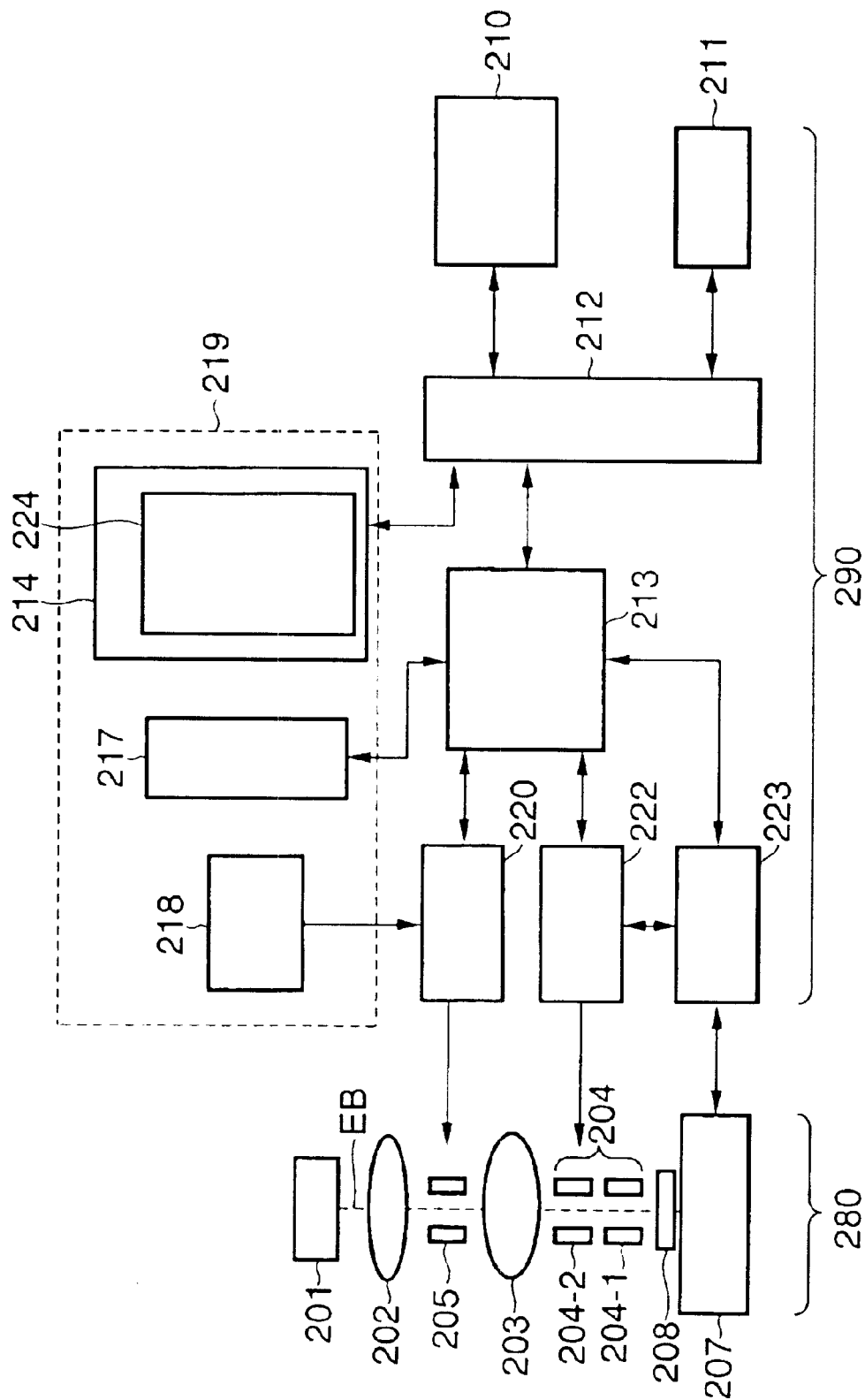
FIG. 10 is a block diagram showing an electron beam drawing apparatus.
Figure 11A:
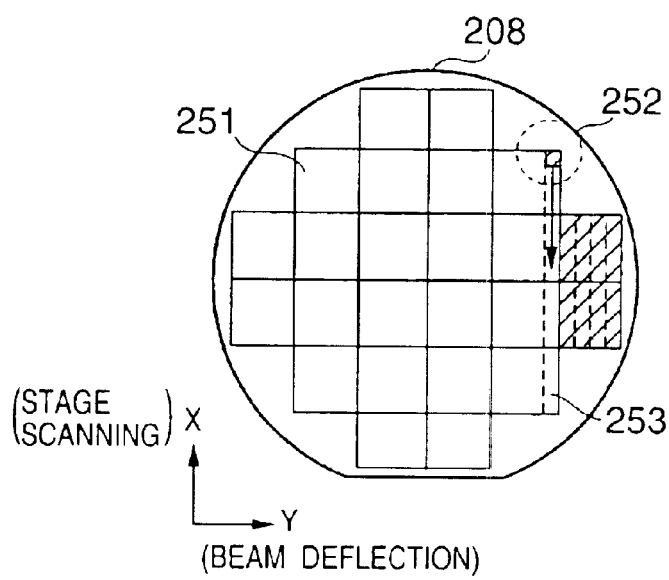
Figure 11B:
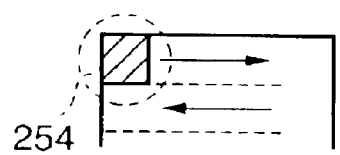
Figure 11C:
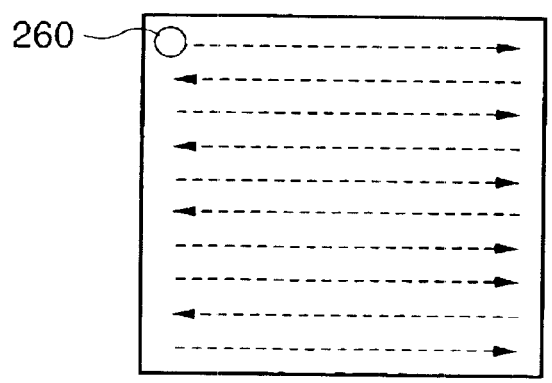

The drawing data flow shown in FIG. 4 can be applied not only to the electron beam drawing apparatus using a single beam shown in FIG. 10, but also to the following electron beam drawing apparatus using multi-beams.

Figure 5A:
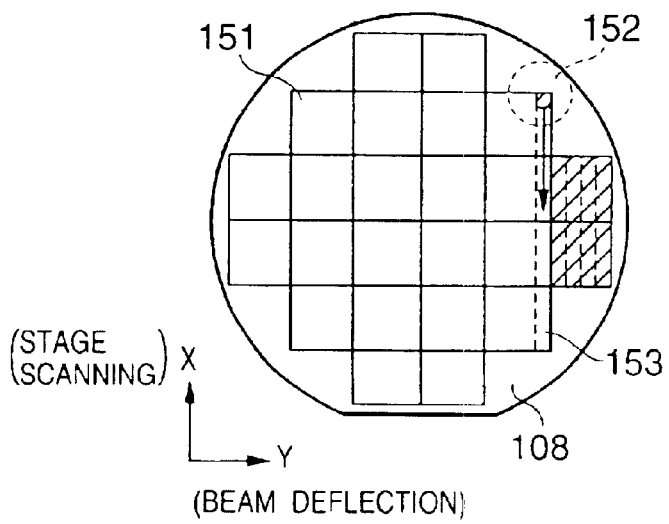
Figure 5B:
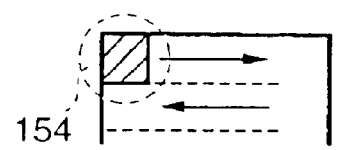
Figure 5C:
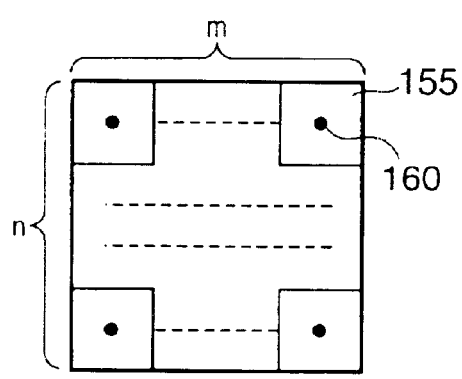
Figure 5D:
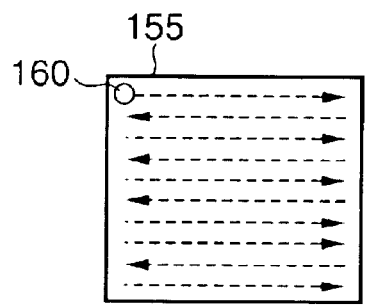

FIGS. 5A and 5B are views showing a drawing method for the electron-beam drawing apparatus using multi-beams. As shown in FIG. 5A, a stripe 153 on a chip 151 is drawn on a wafer 108 placed on the stage during scanning in the X direction. As shown in FIG. 5B, a main field 152 is formed by scanning in the stripe direction and vertical direction by a main deflector. As shown in FIG. 5C, a subfield 154 is formed by a plurality of beams arranged in m rows×n columns (m and n are integers of 1 or more) in units of basic drawing regions 155. A pattern is drawn in this subfield by simultaneously deflecting m×n beams by a sub-deflector. FIG. 5D shows a state in which a beam spot 160 scans the basic drawing region 155 to draw a pattern.

High-speed drawing is realized by a drawing method of parallel-arranging basic drawing regions defined by the deflection method of the electron beam drawing apparatus using multi-beams. However, this method poses problems in data conversion and data transfer, similar to the prior art, when the size of the basic drawing region does not coincide with the periodicity of design pattern data. To the contrary, a method of registering periodic patterns larger and smaller in size than the basic drawing region as cell patterns MC and SC, cutting out cell patterns in drawing, and forming basic drawing regions, as shown in FIGS. 1 to 3, is a drawing pattern data compression method effectively utilizing the periodicity of design pattern data. This method can greatly shorten the transfer time of drawing pattern data.

Figure 6:
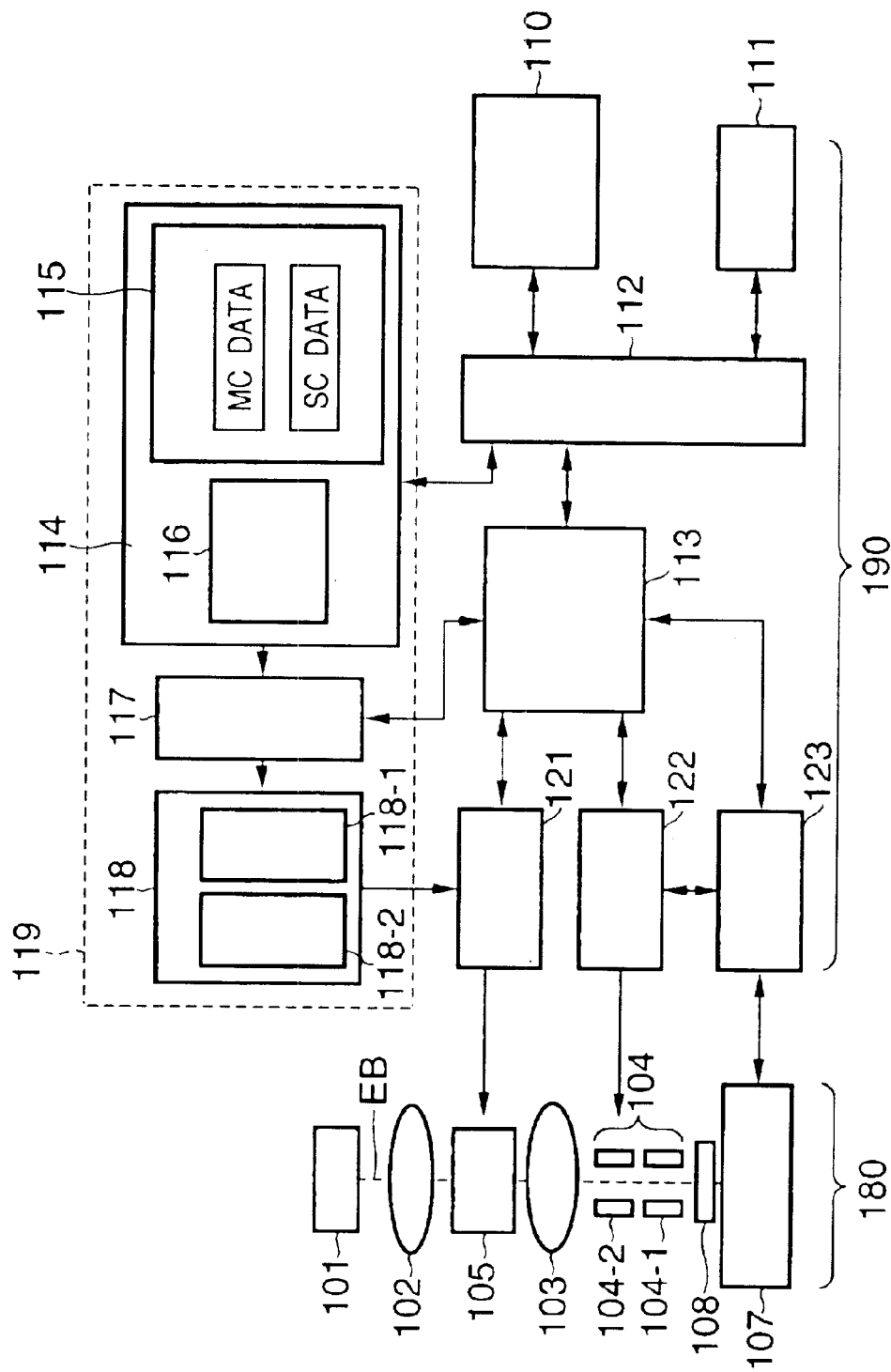
FIG. 6 is a block diagram showing the electron beam drawing apparatus using multi-beams.

FIG. 6 is a block diagram showing an electron beam drawing apparatus using multi-beams. Compared to the electron beam drawing apparatus in FIG. 10, the drawing speed is increased using a plurality of electron beams. FIG. 6 shows the drawing step in FIG. 4. The electron id beam drawing apparatus in FIG. 6 is different from that in FIG. 10 in that a BAA unit 105 capable of ON/OFF-controlling a plurality of electron beams EB is disposed instead of the blanker.

Compared to FIG. 10, a drawing control system 190 is characterized by a BAA control unit 121, and a buffer memory 114, arrangement calculation processing 117, and pattern memory 118 for parallel-controlling a plurality of blankers arranged in m rows×n columns, which are incorporated in a drawing data processing unit 119.

Figure 7:
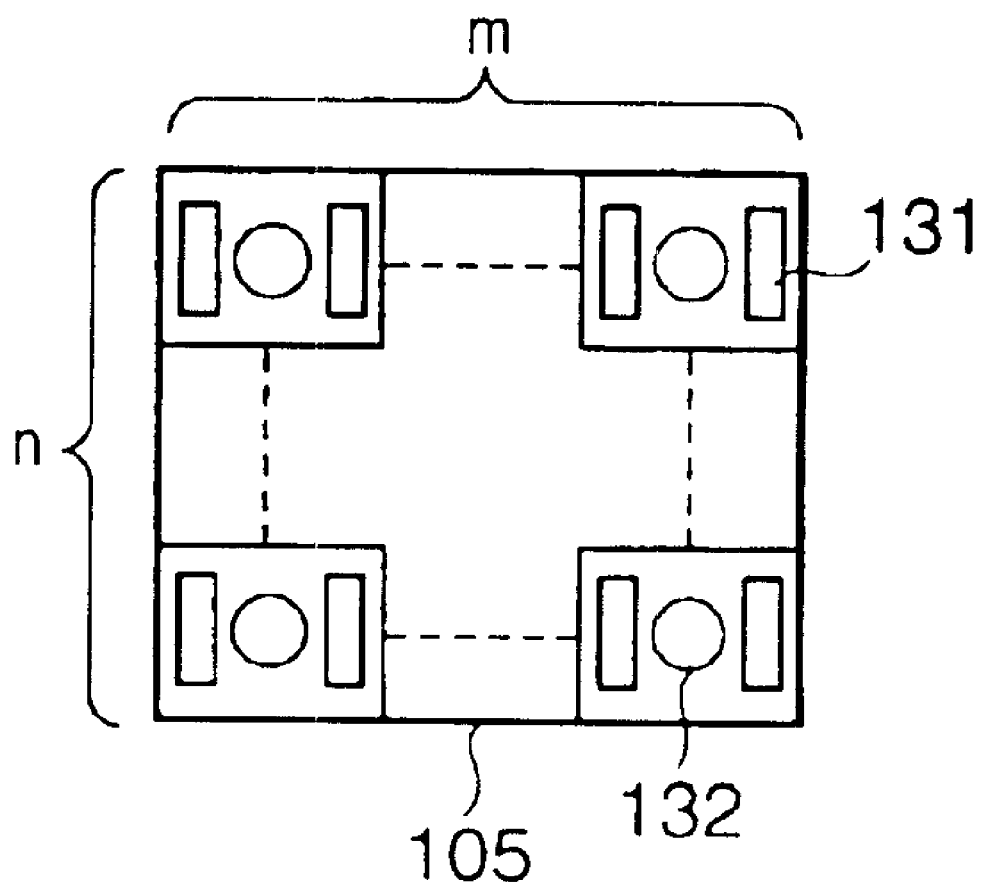
FIG. 7 is a view for explaining a BAA.

The BAA unit 105 will be described with reference to FIG. 7. FIG. 7 is a plan view showing the BAA unit when viewed from the top. Basic units each made up of an aperture 132 for transmitting the electron beam EB and surrounding small-size blankers 131 are arranged in an m×n matrix. The arrangement period of the blankers correspond to the period of basic drawing regions.

The drawing step in FIG. 4 will be explained with reference to FIG. 6. An external storage device 110 in the drawing control system 190 stores drawing pattern data made up of cell patterns MC and SC and arrangement pattern data. Before drawing starts, this drawing pattern data is transferred to the areas of cell pattern data 115 and arrangement data 116 in the buffer memory 114 via a CPU 112. After drawing starts, the arrangement data 116 is read in the arrangement calculation processing 117, and bitmap drawing data mapping processing is done in units of basic drawing regions using the cell patterns MC and SC of the buffer memory 114 based on the arrangement data 116. After that, the processed data is transferred to the pattern memory 118.

In this case, bitmap data of stripes which can be drawn by one stage scanning is transferred to a pattern memory (A) 118-1. This bitmap data is parallel-transferred to the BAA control unit 121 as signals for ON/OFF-controlling the beam. A pattern is drawn in synchronism with a deflector control unit 122 and a stage control unit 123. While stripe data (A) 118-1 (pattern memory) is drawn, bitmap data of stripe data (B) 118-2 for the next drawing is prepared. Thus, drawing of the stripe data (B) 118-2 can start immediately after the stripe data (A) 118-1 is drawn.

The two pattern memories A and B are adopted in FIG. 6, but three or more parallel pattern memories may be used to shorten the drawing time.

In arrangement calculation processing, the region of cell pattern data made from bitmap data is designated, and pattern data is cut out to form data of a basic drawing region. As this method, a graphic RAM capable of extracting an arbitrary memory area can be used to increase the speed.

This embodiment has exemplified multi-beams arranged two-dimensionally. However, the present invention can also be applied when the array of electron beams arranged not two-dimensionally but one-dimensionally is deflected, or a two-dimensional pattern is drawn by stage scanning.

Figure 8:
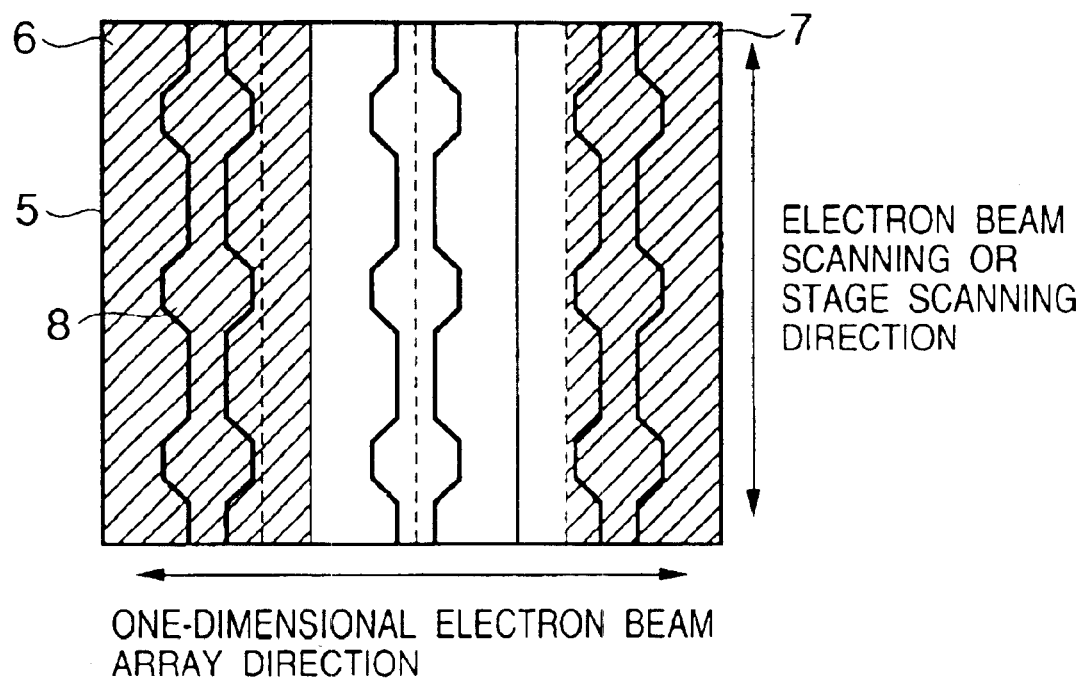
FIG. 8 is a view showing design pattern data divided into cell patterns and basic drawing regions for multi-beam drawing using a one-dimensional arrangement.
Figure 9:
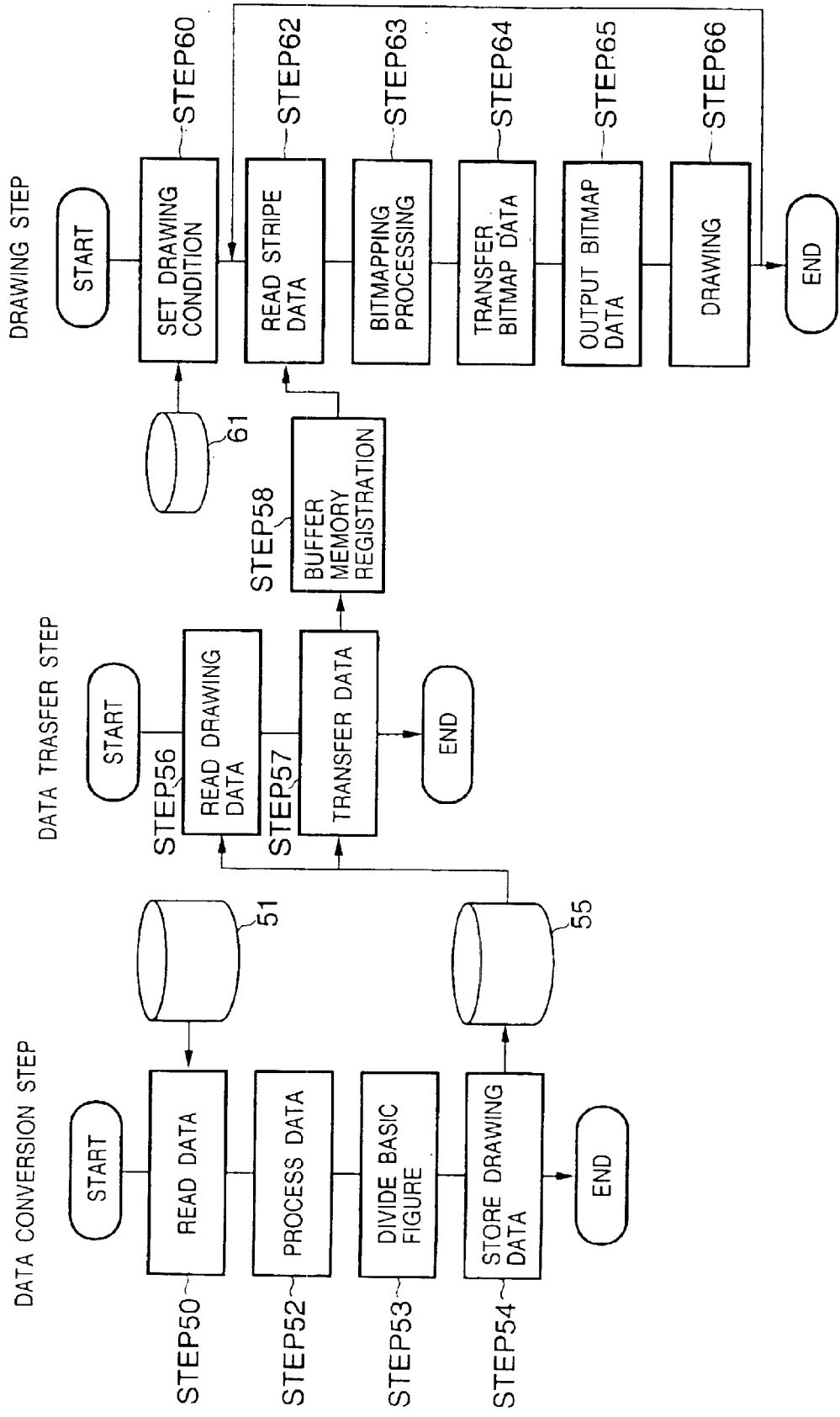
FIG. 9 is a flow chart showing the data flow (prior art) of a drawing system.

FIG. 8 shows a case in which a two-dimensional pattern region is drawn by electron beam scanning or stage scanning in a direction perpendicular to a one-dimensional electron beam array direction. In FIG. 10, similar to FIG. 1, design pattern data 5 is divided into cell patterns 6 (solid-line regions of the design pattern data 5) and basic drawing regions 7 (dotted-line regions of the design pattern data 5). In this case, each basic drawing region 7 has an elongated stripe shape. Similarly, each cell pattern 6 has a stripe shape conforming to the repetitive periodic structure of the design pattern data 5. Each basic drawing region 7 can use arrangement data to form drawing data.

As described above, drawing pattern data containing cell patterns and arrangement data is formed utilizing the periodicity of design pattern data. The data is transferred and stored in the buffer memory. Based on the arrangement data, cell pattern data is An rearranged to create bitmap drawing data. Hence, the drawing pattern data creation method and the electron beam drawing apparatus using the same according to the present invention are effective not only for an electron beam drawing apparatus using a single electron beam, but also for a multi-beam drawing system using a BAA unit and a multi-beam drawing system using one-or two-dimensionally arranged solid-state electron sources formed by micropatterning.

The present invention can also be applied not only to a drawing apparatus using an electron beam, but also to a drawing apparatus using an ion beam.

The present invention can compress data more effectively than the prior art because pattern data is registered as a cell pattern without destroying the periodicity. The time required for data transfer from a magnetic disk to a buffer memory can be shortened, and the capacity of the buffer memory can be reduced. This greatly contributes to increasing the reliability and the availability of the apparatus without decreasing the drawing throughput of the electron beam drawing apparatus along with shrinkage in feature size and increase in integration degree.

As many apparently widely different embodiments of the present invention can be made without departing from the spirit and scope thereof, it is to be understood that the invention is not limited to the specific embodiments thereof except as defined in the appended claims.

What is claimed is:

1. A charged-particle beam drawing method of supplying bit information created from design pattern data in a scanning direction of a charged-particle beam, ON/OFF-controlling the charged-particle beam to irradiate a sample surface, and exposing a two-dimensional pattern by scanning the charged-particle beam, the method comprising the steps of:

extracting a cell pattern as one unit of a periodic structure from design pattern data having a periodic structure, and registering the cell pattern;

creating arrangement data to be rearranged in a basic drawing region defined by a charged-particle beam exposure apparatus using the cell pattern, and registering the arrangement data; and cutting out data from the cell pattern in accordance with information of the arrangement data, and creating data of the basic drawing region.

2. The method according to claim 1, wherein the basic drawing region includes all or some of regions of a plurality of cell patterns.

3. The method according to claim 1, wherein the cell pattern is not smaller in size than the basic drawing region.

4. The method according to claim 1, wherein the cell pattern is smaller in size than the basic drawing region.

5. The method according to claim 1, wherein the basic drawing region includes at least some of cell patterns not smaller in size than the basic drawing region and some of cell patterns smaller in size than the basic drawing region.

6. The method according to claim 1, wherein the cell pattern is not less than twice the size of the basic drawing region.

7. The method according to claim 1, wherein the cell pattern is formed from bitmap data.

8. A charged-particle beam exposure apparatus for supplying bit information created from design pattern data in a scanning direction of a charged-particle beam, ON/OFF-controlling the charged-particle beam to irradiate a sample surface, and exposing a two-dimensional pattern by scanning the charged-particle beam, the apparatus comprising:

means for extracting a cell pattern as one unit of a periodic structure from design pattern data having a periodic structure, and registering the cell pattern;

means for creating arrangement data to be rearranged in a basic drawing region defined by the charged-particle beam exposure apparatus using the cell pattern, and registering the arrangement data; and means for cutting out data from the cell pattern in accordance with information of the arrangement data, and creating data of the basic drawing region.

9. The apparatus according to claim 8, wherein the basic drawing region includes all or some of regions of a plurality of cell patterns.

10. The apparatus according to claim 8, wherein the cell pattern is not smaller in size than the basic drawing regions.

11. The apparatus according to claim 8, wherein the cell pattern is smaller in size than the basic drawing region.

12. The apparatus according to claim 8, wherein the basic drawing region includes at least some of cell patterns not smaller in size than the basic drawing region and some of cell patterns smaller in size than the basic drawing region.

13. The apparatus according to claim 8, wherein the cell pattern is not less than twice the size of the basic drawing region.

14. The apparatus according to claim 8, wherein the cell pattern is formed from bitmap data.

15. The apparatus according to claim 8, further comprising:

a plurality of charged-particle beams and a plurality of beam-ON/OFF means arranged in m rows×n columns, wherein in a drawing method of drawing patterns in parallel with each other in respective basic drawing regions by the charged-particle beams, bitmap drawing data are supplied in parallel with each other to said respective beam-ON/OFF means in the scanning direction of the charged-particle beam, and the plurality of charged-particle beams are controlled to irradiate a sample surface, thereby drawing a two-dimensional pattern.

16. A device manufacturing method of irradiating a charged-particle beam to a surface based on data of a basic drawing region defined by a charged-particle beam exposure apparatus, and patterning on the surface in accordance with a design pattern, the method comprising the steps of:

extracting a cell pattern as one unit of a periodic structure from the design pattern;

creating arrangement data used in a case of forming the data of the basic drawing region from data of the cell pattern; and forming the data of the basic drawing region from the data of the cell pattern based on the created arrangement data.

17. The method according to claim 16, wherein the step of irradiating a charged-particle beam is sequentially executed in each of a plurality of the basic drawing regions, and the step of extracting the cell pattern and the step of creating the arrangement data are completed before the step of irradiating in the first basic drawing region is started.

18. A charged-particle beam exposure apparatus for patterning on a surface in accordance with a design pattern, the apparatus comprising:

a main body for irradiating a charged-particle beam to the surface based on data of a basic drawing region defined by the charged-particle beam exposure apparatus; and a controller for forming the data of the basic drawing region from data of a cell pattern, extracted as one unit of a periodic structure from the design pattern, based on a parameter.

19. The apparatus according to claim 18, wherein the controller cuts out some of the data of the cell pattern from the data of the whole cell pattern based on the parameter, and the parameter includes a position for cutting out and a size for cutting out.

20. The apparatus according to claim 18, wherein the apparatus executes patterning on the surface using a plurality of the charged-particle beams, and the main body irradiates each of the plurality of charged-particle beams based on each of the data of a plurality of the basic drawing regions.

* * * * *

UNITED STATES PATENT AND TRADEMARK OFFICE
CERTIFICATE OF CORRECTION

PATENT NO. : 6,787,784 B1
DATED : September 7, 2004
INVENTOR(S) : Masahiko Okunuki It is certified that error appears in the above-identified patent and that said Letters Patent is hereby corrected as shown below:

Column 2,
Lines 16-21, should be deleted.

Column 4,
Line 66, "size" should read -- size of --.

Column 7,
Line 32, "imposition" should read -- position --.

Column 9,
Line 39, "id" should be deleted.

Column 10,
Line 43, "An" should be deleted.

Signed and Sealed this

Eleventh Day of January, 2005

JON W. DUDAS
*Director of the United States Patent and Trademark Office*